United States Patent
Nishiyama et al.

(10) Patent No.: US 7,166,545 B2
(45) Date of Patent: Jan. 23, 2007

(54) PRODUCTION METHOD FOR SEMICONDUCTOR DEVICE

(75) Inventors: Norikazu Nishiyama, Toyonaka (JP); Korekazu Ueyama, Takarazuka (JP); Yoshiaki Oku, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 157 days.

(21) Appl. No.: 10/490,767

(22) PCT Filed: Sep. 17, 2002

(86) PCT No.: PCT/JP02/09511

§ 371 (c)(1),
(2), (4) Date: Mar. 25, 2004

(87) PCT Pub. No.: WO03/028097

PCT Pub. Date: Apr. 3, 2003

(65) Prior Publication Data

US 2005/0003678 A1    Jan. 6, 2005

(30) Foreign Application Priority Data

Sep. 25, 2001  (JP) .............................. 2001-292088

(51) Int. Cl.
*H01L 21/31* (2006.01)
(52) U.S. Cl. .............. 438/780; 438/622; 438/623; 438/781; 438/782; 257/E21.002
(58) Field of Classification Search ............... 438/622, 438/623, 780, 781, 782
See application file for complete search history.

(56) References Cited

U.S. PATENT DOCUMENTS

| 5,399,529 A | 3/1995 | Homma |
| 5,405,805 A | 4/1995 | Homma |
| 5,444,023 A | 8/1995 | Homma |
| 6,329,017 B1 * | 12/2001 | Liu et al. .................. 427/240 |

FOREIGN PATENT DOCUMENTS

| JP | 2-237030 | 9/1990 |
| JP | 6-349817 | 12/1994 |
| JP | 11-241117 | 9/1999 |

* cited by examiner

*Primary Examiner*—Zandra V. Smith
*Assistant Examiner*—Christy Novacek
(74) *Attorney, Agent, or Firm*—Hamre, Schumann, Mueller & Larson, P.C.

(57) ABSTRACT

The invention aims at providing a dielectric film having a low dielectric constant and enhanced mechanical strength. A surfactant and an silica derivative are dissolved into a solvent at a desired mole ratio. The precursor solution is applied over the substrate, and the substrate is exposed to a silica derivative atmosphere before being sintered, thereby supplying a silica derivative. Thus, contraction of the film stemming from hydrolysis is inhibited, and a sturdy mesoporous silica thin film which takes the self-assembly of the surfactant as a mold is obtained while cavities are maintained intact without being fractured. Thus, there is formed an inorganic dielectric film which is formed on the surface of the substrate and has a cyclic porous structure including layered or columnar pores oriented so as to become parallel with the surface of the substrate.

12 Claims, 13 Drawing Sheets

FIG. 13

| | | COMPOSITION OF COATING LIQUID (MOLE RATIO) | | | | | | MOLE RATIO | HEAT TREAT-MENT | | TEOS TREAT-MENT | | NUMBER OF RO-TATIONS | RESULT OF XRD MEASUREMENT (INTERVAL BETWEEN SURFACE/d SPACE) | | | | CON-TRAC-TION RATE (%) |
|---|---|---|---|---|---|---|---|---|---|---|---|---|---|---|---|---|---|---|
| | SAMPLE | WATER | TEOS | CTAB | HCl | ETHA-NOL | | CTAB/TEOS | TEMP. (°C) | TIME (HRS) | TEMP. (°C) | TIME (HRS) | rpm | AFTER COATING AND DRYING (a) | AFTER HEAT TREAT-MENT (b) | AFTER TEOS TREAT-MENT (e) | AFTER SINTER-ING (c) | BEFORE AND AFTER SINTER-ING |
| TEOS TREAT-MENT | 3 | 100 | 3 | 0.5 | 2.5 | 50 | | 0.17 | | | 135 | 12 | 4000 | 3.84 | | 3.65 | 3.53 | 3.2 |
| | 4 | 100 | 3 | 0.5 | 2.5 | 50 | | 0.17 | | | 135 | 12 | 4000 | 3.77 | | 3.68 | 3.62 | 1.6 |
| | 7 | 100 | 3 | 0.5 | 2.5 | 50 | | 0.17 | | | 135 | 12 | 4000 | 3.48 | | 3.56 | 3.48 | 2.4 |
| | 11 | 100 | 3 | 0.5 | 2.5 | 50 | | 0.17 | | | 135 | 12 | 2000 | 3.91 | | 3.87 | 3.84 | 0.9 |
| | 13 | 100 | 3 | 0.5 | 1.0 | 50 | | 0.17 | | | 135 | 6 | 4000 | 3.62 | | 3.65 | 3.45 | 5.5 |
| | 14 | 100 | 3 | 0.5 | 1.0 | 50 | | 0.17 | | | 135 | 6 | 4000 | 3.56 | | 3.50 | 3.25 | 7.4 |
| | 15 | 100 | 3 | 0.5 | 1.0 | 50 | | 0.17 | | | 135 | 6 | 4000 | 3.53 | | 3.62 | 3.27 | 9.6 |
| | 16 | 100 | 3 | 0.5 | 1.0 | 50 | | 0.17 | | | 135 | 6 | 4000 | 3.48 | | 3.48 | 3.29 | 5.2 |
| | 5 | 100 | 3 | 0.5 | 0.5 | 50 | | 0.17 | | | 135 | 12 | 4000 | 3.77 | | 3.59 | 3.56 | 0.8 |
| HEAT TREAT-MENT ONLY | 6 | 100 | 3 | 0.5 | 2.5 | 50 | | 0.17 | 135 | 12 | | | 4000 | 3.65 | 3.68 | | 2.89 | 21.6 |
| | 1 | 100 | 3 | 0.5 | 0.5 | 50 | | 0.17 | 135 | 12 | | | 4000 | 3.65 | 3.42 | | 2.94 | 14.0 |
| NO TREAT-MENT | 8 | 100 | 3 | 0.5 | 2.5 | 50 | | 0.17 | | | | | 4000 | 3.50 | | | 2.66 | 24.1 |
| | 9 | 100 | 3 | 0.5 | 2.5 | 50 | | 0.17 | | | | | 4000 | 3.98 | | | 2.74 | 31.1 |
| | 10 | 100 | 3 | 0.5 | 2.5 | 50 | | 0.17 | | | | | 4000 | 3.74 | | | 2.78 | 25.8 |
| | 12 | 100 | 3 | 0.5 | 2.5 | 50 | | 0.17 | | | | | 2000 | 3.68 | | | 2.98 | 18.9 |
| | 17 | 100 | 3 | 0.5 | 1.0 | 50 | | 0.17 | | | | | 4000 | 3.45 | | | 2.69 | 21.9 |
| | 18 | 100 | 3 | 0.5 | 1.0 | 50 | | 0.17 | | | | | 4000 | 3.56 | | | 2.81 | 21.0 |
| | 2 | 100 | 3 | 0.5 | 0.5 | 50 | | 0.17 | | | | | 4000 | 3.74 | | | 2.94 | 21.3 |

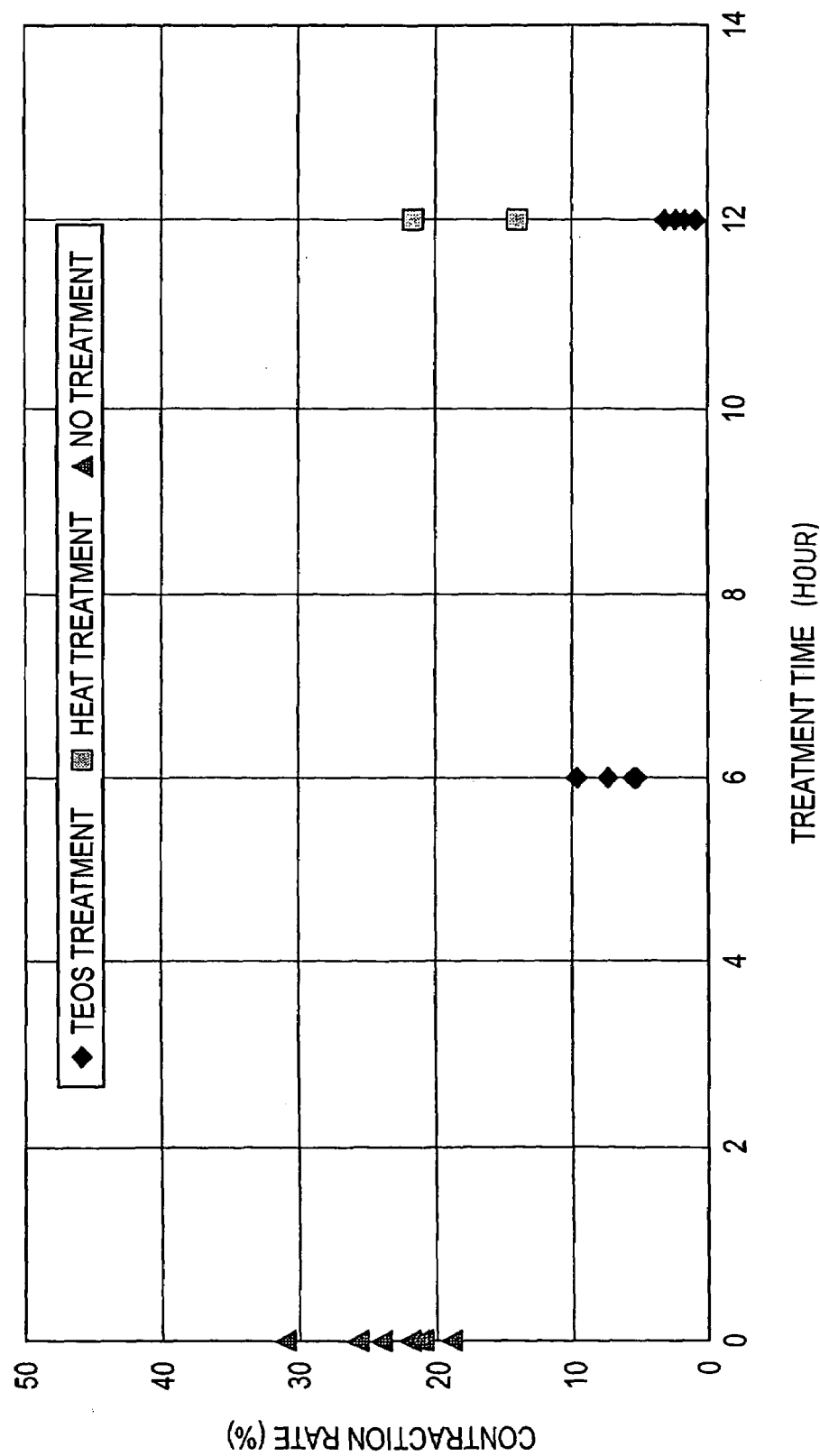

PRODUCTION METHOD FOR SEMICONDUCTOR DEVICE

FIELD OF THE INVENTION

The invention relates to a method for manufacturing a semiconductor device, and more particularly, to an inorganic dielectric film of low dielectric constant.

BACKGROUND

Lowering the dielectric constant of an interlevel insulating film is one of important problems to be solved for fabricating the semiconductor device that is operating faster and reduces its power consumption. In this regard, various ideas have been implemented with a view toward lowering a dielectric constant.

As for semiconductor devices in the related-arts, the following methods (1) to (3) have been already proposed:
  (1) a method for doping fluorine to a silica film, which is an inorganic dielectric film (as described in, e.g., JP-A-11-241117);
  (2) a method for forming an organic dielectric material having a low dielectric constant as a base material; and
  (3) a method for forming a porous film intentionally.

However, in the case of the method as defined in the method (1), a silica film might be doped with fluorine on the order, at most, of a few percentages in element proportion, due to the restriction being placed by the deterioration problem caused by the moisture resistance of the dielectric film. Therefore, the dielectric constant of silica-based interlevel dielectric film formed by the method (1) might be lowered in limited range, such as from 10% to 15%, as compared with that of being formed in conventional ways.

In the case of the method as defined in the method (2), the heat resistance and mechanical strength might be considerably deteriorated even as compared with those formed by the silica-based interlevel dielectric film by the conventional art, because of organic material as the base material, from which this method is likely to lead to a problem of deteriorating reliability of a semiconductor device.

In the case of the method as defined in the method (3), due to randomness of the porous structure, the mechanical strength of the interlevel dielectric film might be deteriorated remarkably. As the result, the semiconductor device becomes fragile when it is being packaged, which is also ended up being low reliability of the semiconductor device.

Furthermore, since most of the porous films formed (or prepared) by the method (3) do not have a closed porous structure, the moisture resistance of the interlevel dielectric film might be lowered remarkably, which also causes the semiconductor device to decrease its reliability.

As mentioned above, either by the methods of the related-art or the conventional arts, the dielectric film always encounters the problem of difficulty of lowering a dielectric constant and/or a problem of insufficient mechanical strength.

SUMMARY OF THE INVENTION

The invention has been conceived in light of the circumstances to be aimed for providing a dielectric film having a low dielectric constant as well as high mechanical strength.

Accordingly, the invention is characterized by providing a method for manufacturing a semiconductor device, comprising: a process of producing a precursor solution containing a silica derivative and a surfactant; a contact process for bringing the precursor solution into contact with the surface of a substrate; a treatment process for exposing to a silica derivative atmosphere the substrate with which the precursor solution has been brought into contact; and a process for calcining the substrate to decompose and remove the surfactant, whereby a dielectric film is formed.

According to the configuration, the surfactant and the silica derivative are dissolved into a solvent at a desired molar ratio. A precursor solution is prepared in a mixing container, and the solution is applied over the substrate. The silica derivative is subjected to polymerization through hydrolysis (polycondensation reaction) (i.e., a preliminary crosslinking process), thereby forming a mesoporous silica thin film having cavities, the cavities being formed by taking a periodic self-assembly of the surfactant as a mold. The surfactant, which has acted as the mold, is completely thermally decomposed and removed during a calcining process, thereby forming a pure mesoporous silica thin film. At this time, the substrate is exposed to a silica derivative atmosphere before being subjected to calcining, and then dried (heated) while being supplied with the silica derivative. As a result, contraction of the film stemming from hydrolysis is inhibited, and a sturdy mesoporous silica thin film which takes the self-assembly of the surfactant as a mold is obtained while the cavities are maintained intact without being fractured. The surfactant that acts as a mold is completely thermally decomposed and removed in the calcining process, to thereby produce a pure mesoporous silica thin film.

In this way, provision of a dielectric film which has extremely superior controllability, superior mechanical strength, and a minimum dielectric constant becomes feasible. Since the dielectric film can be formed at low temperature, a highly-reliable dielectric film can be formed without affecting the substrate even when the dielectric film is used as an interlevel dielectric film of an integrated circuit.

The porosity can be adjusted as required by adjusting the concentration of the precursor solution. A dielectric thin film of desired dielectric constant can be formed with extremely superior operability.

Thus, an inorganic dielectric film having a porosity of 50% or higher is formed. Since the dielectric constant of air is low, by means of such a configuration the dielectric constant of the dielectric film can be reduced further as compared that achieved when the dielectric film is doped with fluorine. Hence, the dielectric constant of the dielectric film can be minimized.

The inorganic dielectric film can also be formed such that pores possess an orientation characteristic. As a result, the pores possess an orientation characteristic. Since the inorganic dielectric film has the cyclic porous structure, mechanical strength of the dielectric film can be enhanced, and a dielectric film of high reliability can be obtained.

The inorganic dielectric film can also be formed so as to assume a cyclic porous structure in which columnar pores are oriented so as to become parallel with the surface of the substrate. As a result, since the pores are oriented in parallel with the surface of the substrate, a low, uniform dielectric constant is achieved in the direction perpendicular to the surface of the substrate. Particularly when the dielectric film is used as an interlevel dielectric film, the pores can assume a closed structure in which no opening sections are provided for upper layer wiring or lower layer wiring. Hence, the dielectric film plays the role of an effective low dielectric thin film having superior moisture resistance and enhanced reliability.

Moreover, the inorganic dielectric film can also be formed so as to include a plurality of cyclic porous structure domains containing columnar pores oriented in one direction so as to become parallel with the surface of the substrate, and adjacent porous structure domains can be oriented in different directions. As a result, since the porous structure is oriented in a different direction in each domain, the opening sections of the pores can be closed by each other. There can be obtained a low dielectric thin film having superior moisture resistance substantially equal to that of a dense film, superior mechanical strength derived from a cyclic structure, and an ultimately low dielectric constant. Moreover, an interlevel space is supported by adjacent layers, and hence a layered cyclic porous geometry, which is usually considered to be unstable, can be constituted stably with superior mechanical strength.

The inorganic dielectric film can also be formed on the surface of the substrate so as to assume a cyclic porous structure domain in which layered pores are oriented periodically in one direction so as to become parallel with the surface of the substrate. Since the layered pores are oriented so as to become parallel with the surface of the substrate, a low, uniform dielectric constant is achieved in the direction perpendicular to the surface of the substrate. Particularly when the dielectric film is used as an interlevel dielectric film, the pores can assume a closed structure in which no opening sections are provided for upper layer wiring or lower layer wiring. Hence, the dielectric film plays the role of an effective low dielectric thin film having superior moisture resistance and enhanced reliability. Such a structure enables an attempt to realize a dielectric film which is much higher in porosity and lower in dielectric constant than a dielectric film having cylindrical pores.

Preferably, the invention is characterized in that the treatment process includes a process for bringing the substrate into contact with silica derivative vapor at a temperature at which the surfactant is not thermally decomposed.

The configuration enables good formation of a low dielectric thin film having a high porosity and a superior orientation characteristic without destroying the porous structure.

Preferably, the invention is characterized in that the treatment process is performed at a saturation vapor pressure of silica derivative vapor.

According to the configuration, the substrate undergoes treatment at the saturation vapor pressure, and hence a sufficient amount of silica derivative is efficiently diffused from the surface of the substrate. Thus, a low dielectric thin film having a high porosity and a superior orientation characteristic can be formed without destruction of the porous structure.

A reaction rate is increased by increasing a partial pressure of the silica derivative and the pressure of the same.

Preferably, the invention is characterized in that the treatment process is performed at room temperature to a temperature of 250° C.

According to the configuration, the silica derivative is efficiently supplied to the surface of the substrate. If the temperature is below room temperature, poor reactivity will be achieved. If the temperature has exceeded 250° C., a desired effect may fail to be obtained for reasons of decomposition of the surfactant.

Preferably, the invention is characterized in that the treatment process is performed at a temperature of 90° C. to 200° C.

According to the configuration, diffusion of the silica derivative proceeds well with high reactivity.

Preferably, the invention is characterized in that the treatment process is performed in a vapor atmosphere of TEOS at 90° C. to 200° C.

Such a configuration enables formation of a low dielectric thin film having higher strength.

Preferably, the invention is characterized in that the treatment process is performed in a vapor atmosphere of TMOS at 90° C. to 200° C.

Such a configuration enables formation of a low dielectric thin film having higher strength.

Preferably, the invention is characterized in that the contact process is a process for immersing the substrate into the precursor solution.

The configuration enables formation of a low dielectric thin film with superior productivity.

Preferably, the invention is characterized in that the contact process includes a process for immersing the substrate into the precursor solution and raising the substrate at a desired speed.

The configuration enables formation of a low dielectric thin film with superior productivity.

Preferably, the invention is characterized in that the contact process is a process for applying the precursor solution over the substrate.

The configuration enables formation of a low dielectric thin film with superior productivity.

Preferably, the invention is characterized in that the contact process is a spin coating process for dropping the precursor solution on the substrate and spinning the substrate.

The configuration enables easy adjustment of a film thickness or a porosity and formation of a low dielectric thin film with superior productivity.

Preferably, the invention is characterized by further comprising a preliminary crosslinking process, preceding the contact step, for raising the temperature of the precursor solution to initiate a crosslinking reaction.

According to the configuration, preliminary crosslinking enables efficient progress in crosslinking and high-speed formation of a highly reliable low dielectric thin film.

More preferably, the invention further comprises a preliminary crosslinking process, preceding the contact process, for raising the temperature of the precursor solution to initiate a crosslinking reaction, to thereby bring into contact with the substrate the precursor solution that has started crosslinking reaction in the preliminary crosslinking process. According to the method, after the preliminary crosslinking has been performed, the precursor solution is brought into contact with the surface of the substrate. Hence, crosslinking proceeds efficiently, and a highly reliable low dielectric thin film can be formed at high speed.

A second invention is characterized in that a decomposition removal process is performed through the same process as that of the treatment process and that the substrate is sintered while the silica derivative is being supplied.

Specifically, the invention provides a method for forming a dielectric thin film, comprising: a process of producing a precursor solution containing a silica derivative and a surfactant; a contact process for bringing the precursor solution into contact with the surface of the substrate; and a process for calcining the substrate in a silica derivative atmosphere, to thereby decompose and remove the surfactant.

According to the configuration, when the surfactant serving as a mold is thermally decomposed and removed in the calcining process, a silica derivative is supplied from a gaseous phase. Hence, destruction of the porous structure is inhibited, and a sturdy pure mesoporous silica thin film can be obtained. Sediments are often deposited on the surface of the thin film. In such a case, after formation of the thin film, the substrate may be subjected to surface treatment.

Here, the invention is characterized in that the silica derivative is alkylsilane halide, alkoxysilane halide, alkylalkoxysilane halide, alkoxysilane, or alkylalkoxysilane.

BRIEF DESCRIPTION OF THE DRAWINGS

FIG. 13 is a table describing samples for which composition ratios and TEOS treatment times in the embodiments and comparative example have changed; and FIG. 14 is a view showing a relationship between a treatment time for TEOS treatment and a contraction ratio achieved after calcining operation.

Figure 1:
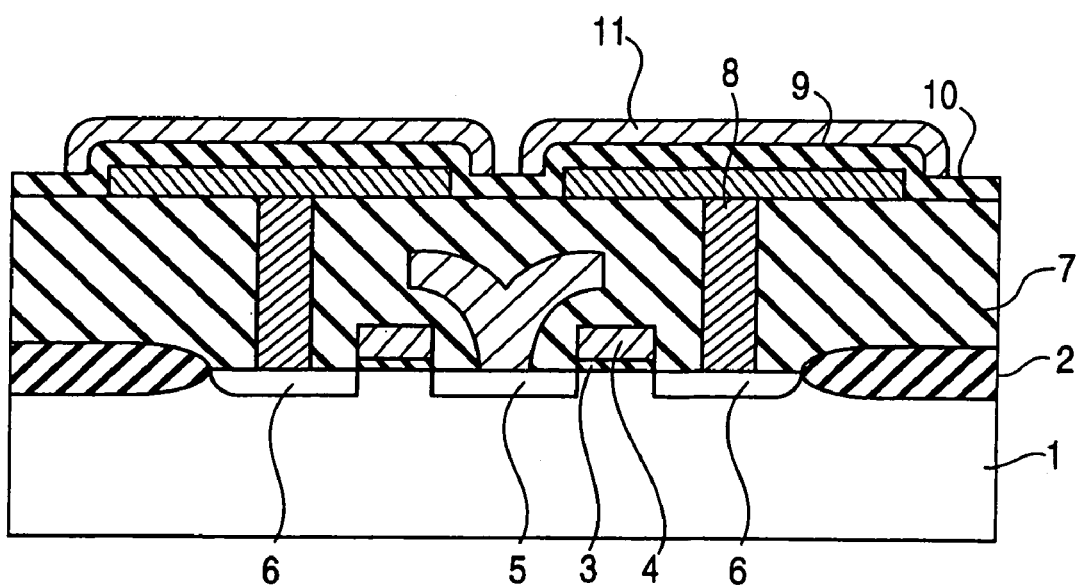
FIGS. 1(a) and 1(b) are the views showing FRAM using a dielectric film formed by means of a method according to a first embodiment of the invention.
Figure 1:
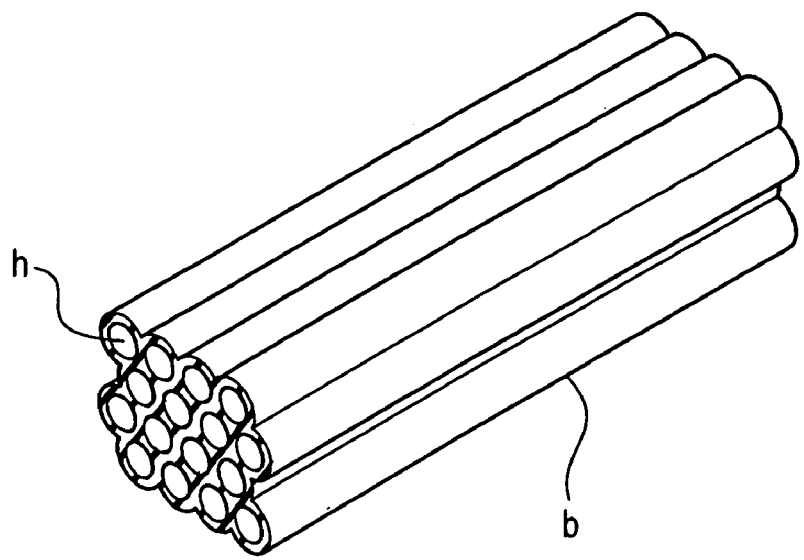

In the drawings, "h" denotes pores; 1 denotes a silicon substrate; 2 denotes an device isolation dielectric film; 3 denotes a gate dielectric film; 4 denotes a gate electrode; 5 denotes a source region; 6 denotes a drain region; 7 denotes a dielectric film; 8 denotes a contact hole; 9 denotes a lower electrode; 10 denotes a ferroelectric film; and 11 denotes an upper electrode.

BEST MODES FOR IMPLEMENTING THE INVENTION

Embodiments of a method for manufacturing a semiconductor device of the invention will now be described in detail by reference to the drawings.

First Embodiment

FRAM using, as an interlevel insulating film, a low dielectric thin film formed by means of a method of this invention is described as a first embodiment of the invention.

The method for forming a low dielectric thin film of the first embodiment of the invention is to provide a highly reliable low dielectric thin film by supplying a precursor solution to the surface of a substrate; leaving the substrate overnight at 90° C. to perform preliminary crosslinking; leaving the substrate in a TEOS atmosphere overnight at 135° C.; diffusing silica vapor in the film to be placed in rigid condition; and calcining the substrate.

As shown in FIGS. 1A and 1B, the FRAM is comprised of a switching transistor fabricated in the region surrounded by an isolation insulating film 2, which is formed on the surface of a silicon substrate 1, and a ferroelectric capacitor. The invention is characterized by use of a low dielectric thin film 7 of the invention as an interlevel dielectric film formed between the switching transistor and a lower electrode 9 of the ferroelectric capacitor. As shown in an enlarged perspective view of the featured section shown in FIG. 1(b), the low dielectric thin film 7 is formed from a mesoporous thin film, wherein the mesoporous thin film is made so as to include a plurality of cyclic porous structure domains, and the domains, each domain including a columnar pore "h," being arranged in one direction to be parallel with the surface of the substrate.

The other portions of the FRAM might be formed by means of the ordinary methods. The switching transistor has a gate electrode 4 formed on the surface of the silicon substrate 1 having a gate dielectric film 3 in-between, and a source region 5 and a drain region 6 formed such that the gate electrode is sandwiched therebetween. The lower electrode 9 is connected to the drain region 6 by way of a contact hole 8, while the source and drain regions are connected to a bit line BL.

The ferroelectric capacitor is formed from a ferroelectric thin film 10 which is made from a PZT with being formed between the lower electrode 9 and an upper electrode 11.

Processes for manufacturing the FRAM will be described by reference to FIGS. 2A to 2D.

First, by means of the ordinary method, the gate electrode 4 is formed on the surface of the silicon substrate 1 by way of the gate dielectric film 3. The substrate is subjected to diffusion of impurities while the gate electrode is taken as a mask, thereby forming the source region 5 and the drain region 6 (FIG. 2(a)).

Subsequently, under the method of the invention, a mesoporous silica thin film is formed to include a plurality of cyclic porous structure domains containing columnar pores oriented in one direction so as to become parallel with the surface of the substrate (FIG. 2(b)).

Specifically, as shown in FIG. 3(a), cationic cetyltrimethyl ammonium bromide [CTAB: $C_{16}H_{33}N^+(CH_3)_3Br^-$] serving as a surfactant; tetramethoxy silane (TMOS) serving as a silica derivative; and hydrochloric acid (HCl) serving as an acid catalyst are dissolved into an $H_2O$/alcohol mixed solvent, thereby preparing a precursor solution within a mixing container. Mole ratios employed for preparing the precursor solution are determined such that 0.5 parts surfactant, 3.0 parts silica derivative, and 0.5 to 2.5 parts acid catalyst are mixed together with the solution being taken as 100 parts (the viscosity of the mixture might be adjusted beforehand, as required). In FIG. 3(b), the mixed solution is dropped onto the substrate 1, being placed on top of a spinner to be subjected to treatment, on which the MOSFET is fabricated. FIG. 3(b) Further, said substrate is spun in a speed at 500 to 5000 rpm, whereby the substrate can be coated with the precursor solution to a desired thickness. This coated substrate 1 is held overnight at room temperature (the temperature may ranging from room temperature to 90° C. or thereabouts), whereby the silica derivative is subjected to polymerization through hydrolysis (i.e., a polycondensation reaction) (in a preliminary crosslinking process), thereby forming a mesoporous silica thin film while acyclic self-assembly of the surfactant is taken as a mold.

The precursor solution is also prepared while the composition of the precursor solution is determined with the solution being taken as 100 parts, the surfactant being taken as 0.05 parts, the silica derivative being taken as 0.1 parts, and the acid catalyst being taken as 2parts. Here, it is desirable to be able to effect efficient coating of the substrate and acquisition of a cyclic structure. A concentration is adjusted so as to control requirements such that contraction is minimized. As a result, a more reliable porous silica thin film can be formed.

Figure 4:
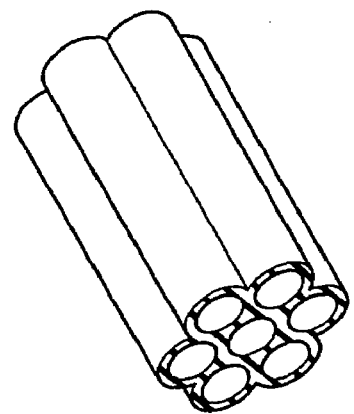
FIGS. 4(a) to 4(d) are the descriptive views showing a dielectric film of the first embodiment of the invention.
Figure 4:
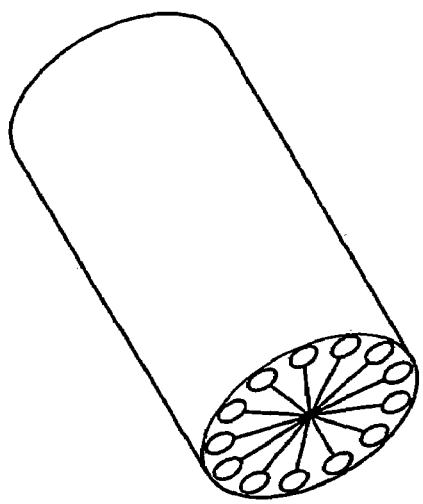
Figure 4:
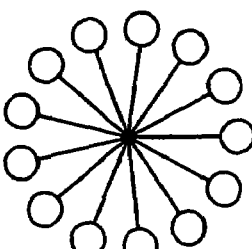
Figure 4:
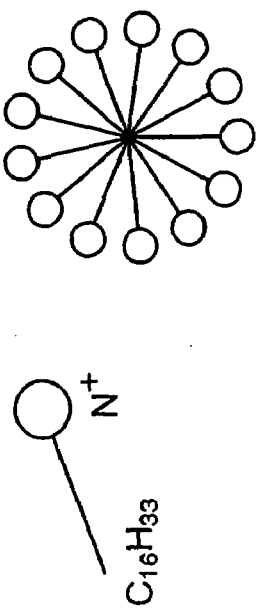

As shown in FIG. 4(*a*), the self-assembly forms a spherical micelle structure (FIG. 4(*b*)) into which a plurality of molecules, each comprising $C_{16}H_{33}N^+(CH_3)_3Br^-$, coagulate. The degree of coagulation is increased as the concentration increases.

Figure 3:
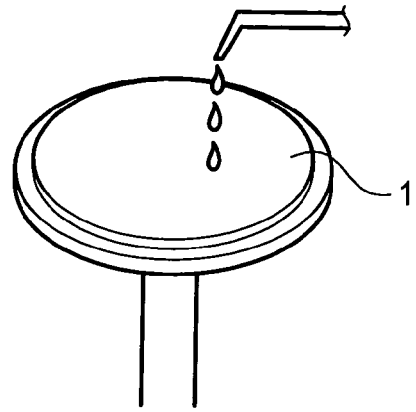
FIGS. 3(a) to 3(d) are the descriptive views showing processes for forming the dielectric film of the first embodiment of the invention.
Figure 3:
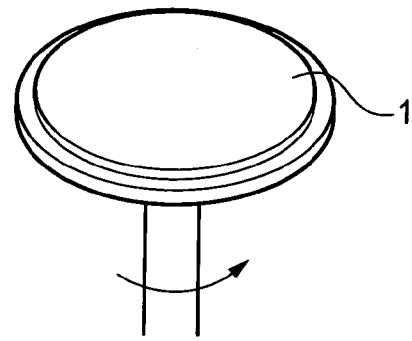
Figure 3:
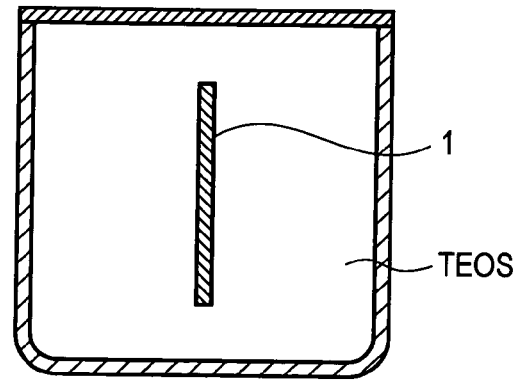
Figure 3:
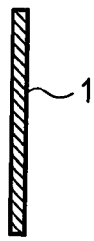

As shown in FIG. 3(*c*), the substrate 1 is dried in a saturated TEOS atmosphere at 135° C. for three to six hours or nearly overnight. The saturated TEOS atmosphere is at a temperature of 120° C. to 180° C., more preferably 120° C. to 150° C. or thereabouts.

Subsequently, as shown in FIG. 3(*d*), the thus-dried substrate 1 is heated and sintered for three hours in the atmosphere at 400° C., to thus completely thermally decompose and remove the surfactant serving a mold and form a pure mesoporous silica thin film.

As the result of the above mentioned procedures, the contraction rate of the thus-sintered mesoporous silica thin film can be suppressed to 2% to 3%.

According to the method, the degree of coagulation is increased as the degree of concentration increases, whereupon the portions of the film from which methyl groups have dropped become cavities (FIG. 4(*c*)). The substrate is subjected to the saturated TEOS atmosphere at 135° C. in this state (FIG. 3(*c*)), whereby the substrate is heated and sintered while the cavities are maintained intact without being destroyed (FIG. 3(*d*)).

Here, although heating and calcining have been described as being performed in the atmosphere, heating and calcining may be performed in an oxygen atmosphere.

Figure 11:
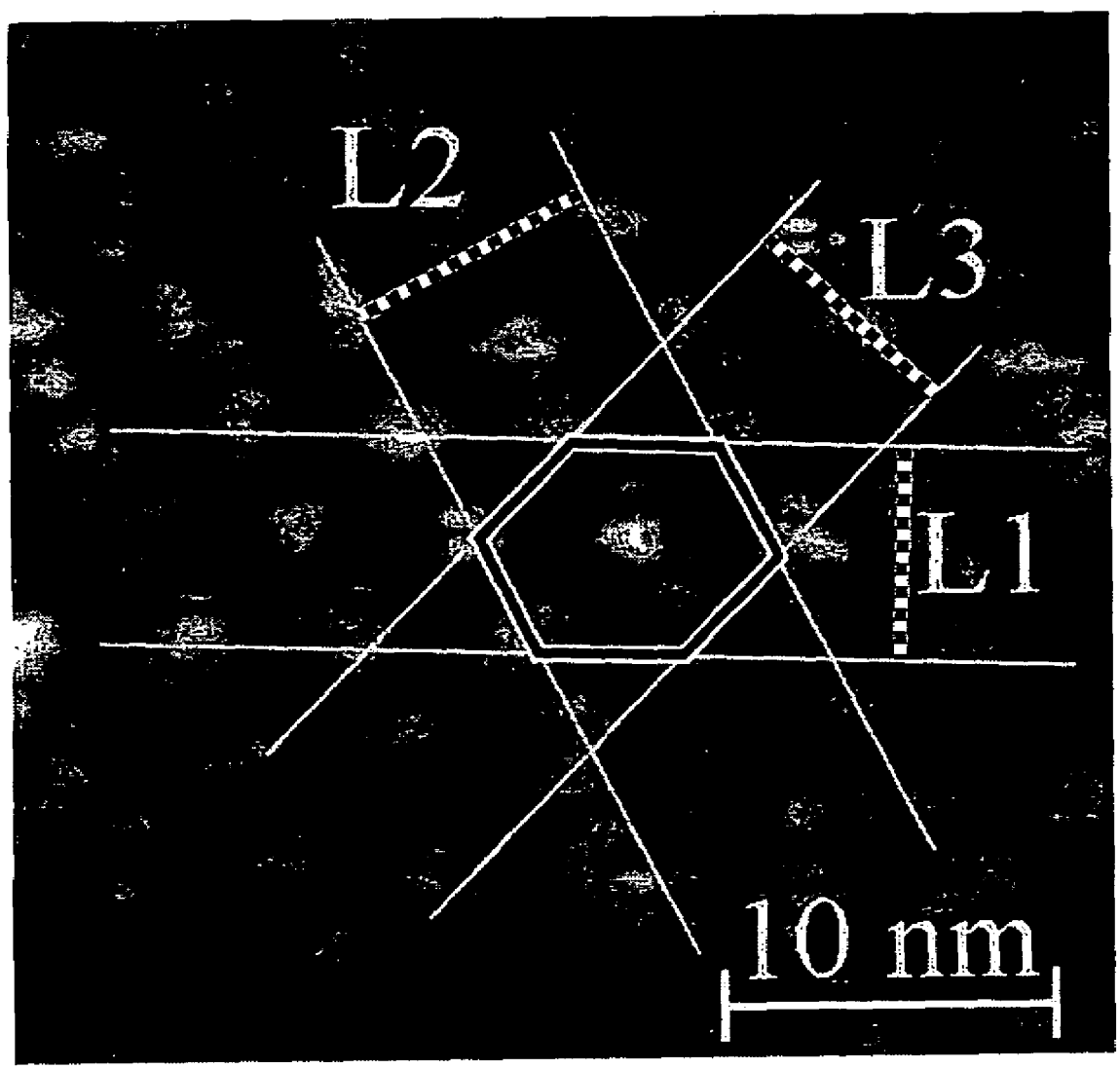
FIG. 11 is a TEM photograph showing a cross-sectional crystalline structure obtained after calcining of the dielectric film according to the first embodiment of the invention.

Therefore, a cylindrical member (FIG. 4(*d*)) having the oriented columnar pores is formed so that a thin film of lower dielectric constant can be obtained. As can be seen from a TEM photograph of a cross section of the low dielectric thin film as shown in FIG. 11, the columnar pores are represented by the areas where bright white images can be identified, and the porous walls can be represented by the gray areas which are surrounding the said white areas. The columnar pores are thus arranged so as to be a hexagonal pattern which enables the thin film to be highly reliable and free of distortions.

Figure 12:
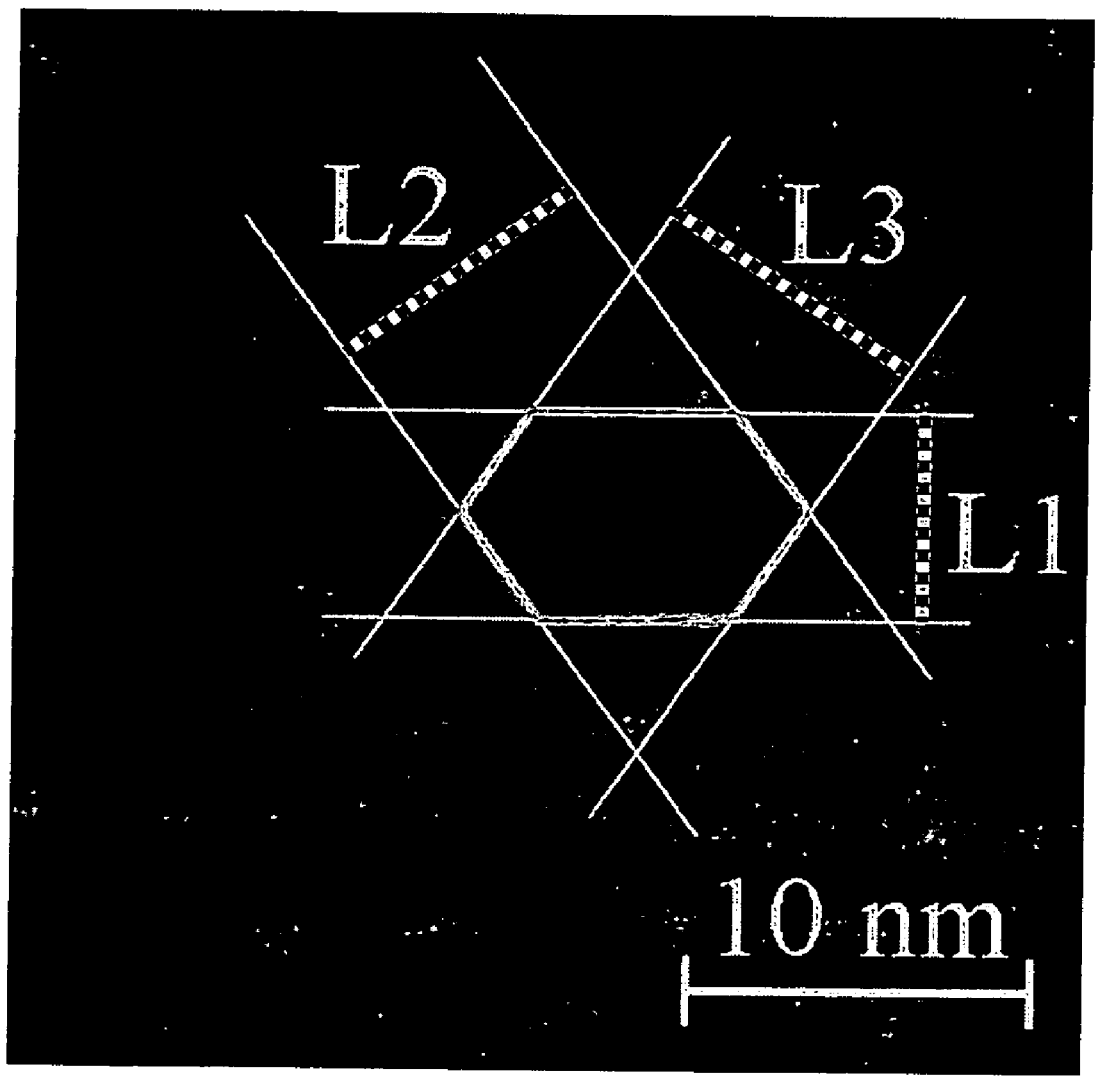
FIG. 12 is a TEM photograph showing a cross-sectional crystalline structure obtained after calcining of a dielectric film of the comparative example (i.e., a dielectric film that has been sintered without having undergone silica derivative treatment)

For the comparison purpose, a cross-sectional TEM photograph in FIG. 12 shows the mesoporous silica thin film that has been heated and sintered without being exposed to the saturated TEOS atmosphere, in which a pattern of the porous walls or gray areas surrounding the columnar pores in bright white images are in distorted hexagonal geometries. This might be because the contraction was made due to the thin film being not exposed to the saturated TEOS atmosphere.

Turning back TEM photograph to in FIG. 11, since the low dielectric thin film is sintered after having been exposed to the saturated TEOS atmosphere, contraction can be suppressed to the minimum level. Thus, thin film becomes a low dielectric thin film that is formed together with a porous thin film whose pores orientation is good.

Figure 2:
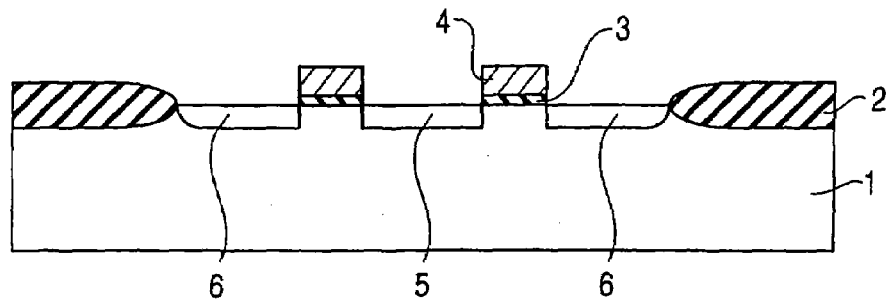
FIGS. 2(a) to 2(d) are the views showing processes for manufacturing the FRAM shown in FIG. 1(a)
Figure 2:
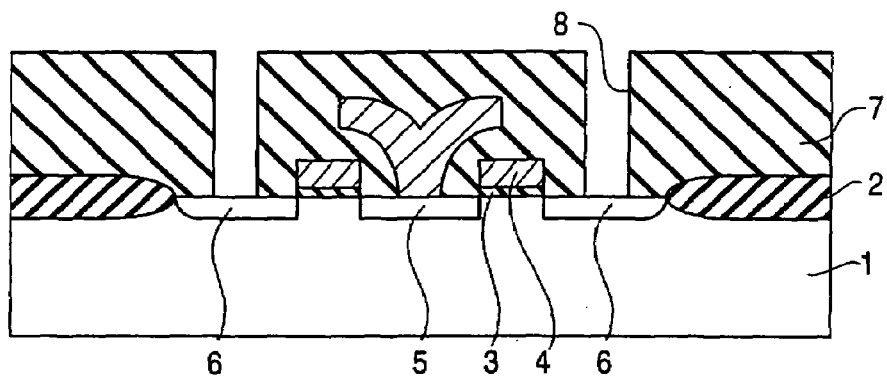
Figure 2:
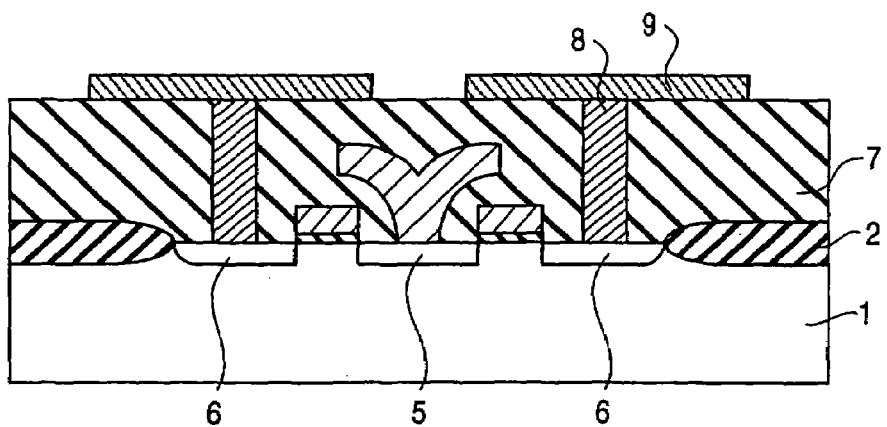
Figure 2:
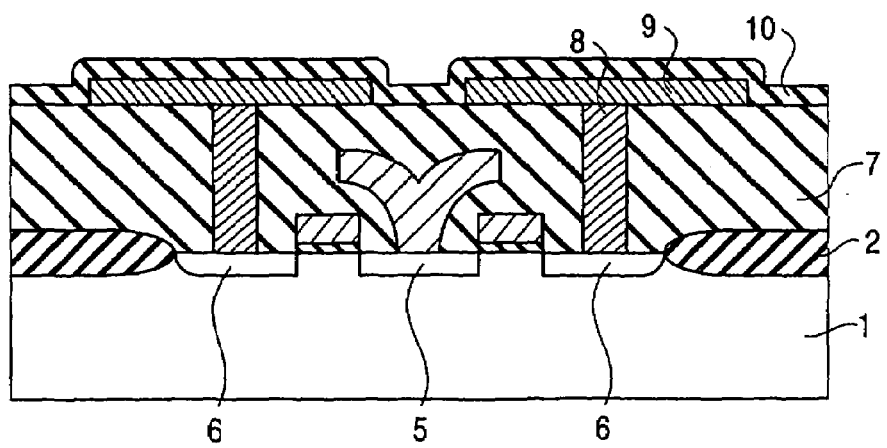

In this way, as shown in FIG. 2(*b*), the thin film 7 of low dielectric constant of the embodiment is formed. However, in order to actually form a bit line BL, the low dielectric thin film must be formed twice.

Subsequently, by means of the ordinary method, contact holes 8 are formed in the thin film 7 of low dielectric constant. After plugs being formed by embedding a highly-doped polycrystalline silicon layer in the respective contact holes, an iridium oxide layer is formed through use of a gas mixture consisting of argon and oxygen while iridium is used as a target. A platinum layer is formed on the iridium oxide layer while platinum is used as a target. In this way, as shown in FIG. 2(*c*), the iridium oxide layer having a thickness of about 50 nm and the platinum layer having a thickness of about 200 nm are formed. These layers are patterned through photolithography, to thereby form the lower electrodes 9.

The PZT film is formed on the lower electrodes 9 as the ferroelectric film 10 by means of the sol-gel method. A mixed solution of $Pb(CH_3COO)_2.3H_2O$, $Zr(t-OC_4H_9)_4$, $Ti(i-OC_3H_7)_4$ is used as a starting material. After the mixed solution has been applied over the substrate through spin coating, the substrate is dried at 150° C. and subjected to pre-calcining for 30 minutes at 400° C. in a dry air atmosphere. After having been repeatedly subjected to these operations five times, the substrate is subjected to heat treatment at a temperature of 700° C. or greater in an $O_2$ atmosphere. Thus, the ferroelectric film 10 having a thickness of 250 nm can be formed. Here, the PZT film is formed while "x" in $PbZr_xTi_{1-x}O_3$ is taken as 0.52 [hereinafter expressed as PZT (52/48)] (FIG. 2(*d*)).

A laminated film consisting of iridium oxide and iridium is formed on the ferroelectric film 10 by means of sputtering. The laminated film consisting of the iridium oxide layer and the iridium layer is taken as an upper electrode 11. The iridium layer and the iridium oxide layer are formed so that the total thickness becomes 200 nm. Thus, a ferroelectric capacitor can be obtained, whereby the FRAM as shown in FIG. 1 is formed.

Figure 5:
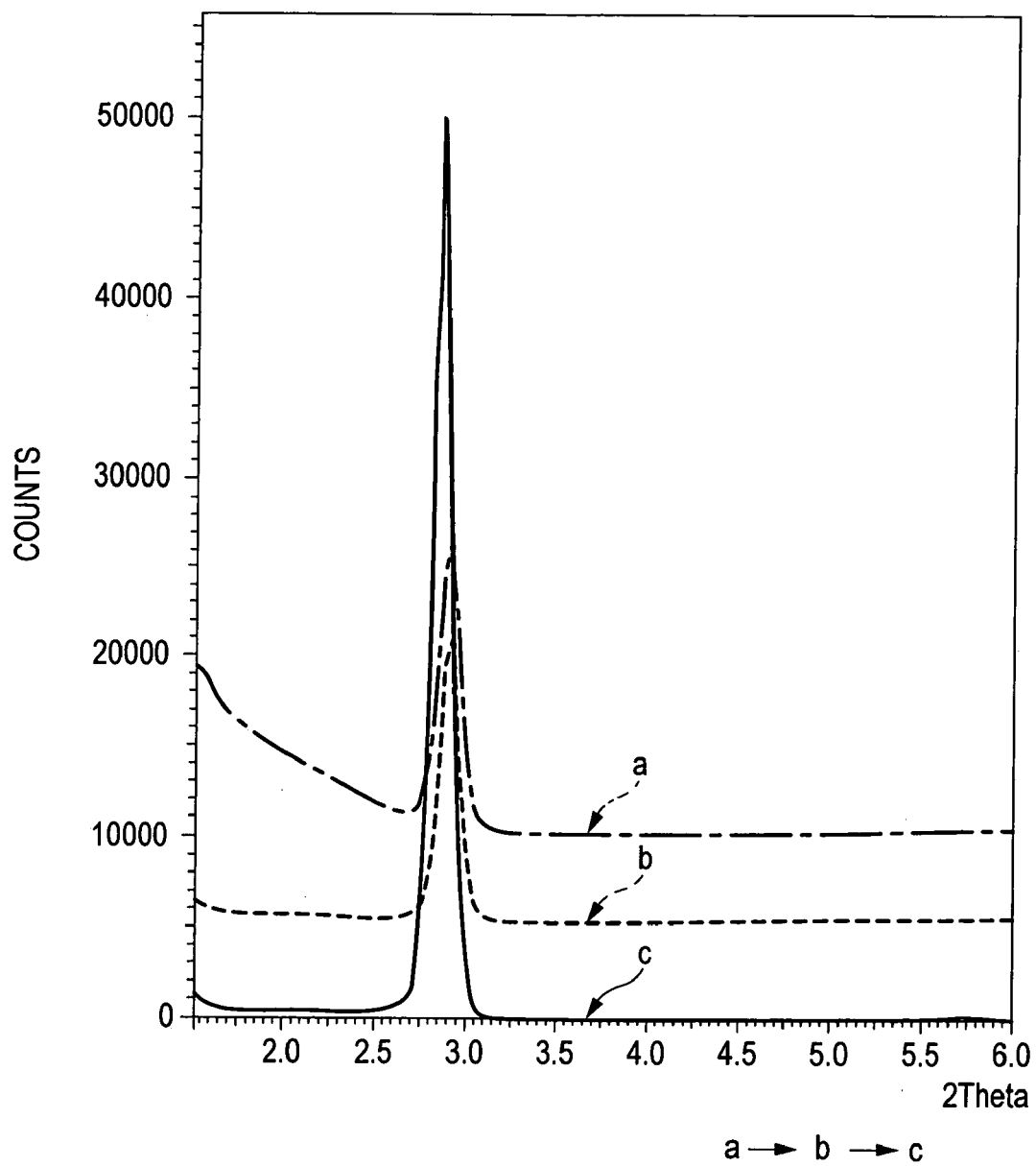
FIG. 5 is a descriptive view showing a result of XRD performed during the course of a film growth process in the first embodiment of the invention.
Figure 10:
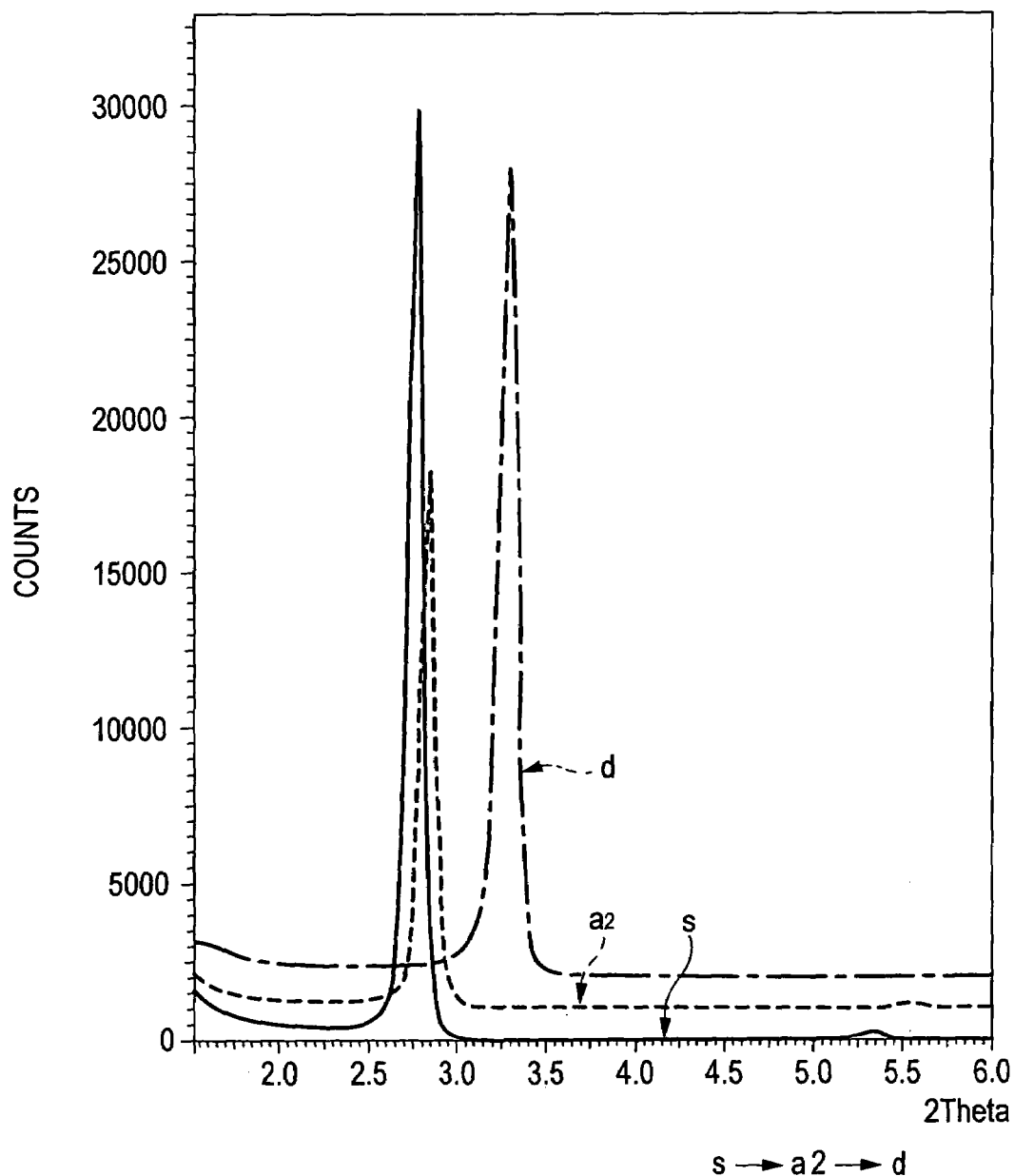
FIG. 10 is a descriptive view showing a result of XRD performed during the course of a film growth process in a comparative example.

FIG. 5 shows a result of X-ray diffraction (XRD) performed at the time of formation of the low dielectric thin film. In FIG. 5, a curve "a" denotes a result of XRD in a state in which a silica derivative has been polymerized through hydrolysis polycondensation reaction (i.e., a preliminary crosslinking process) by holding the silica derivative overnight at 90° C. Curve "b" denotes a state in which the substrate has been heated overnight in a saturated TEOS atmosphere at 135° C. (FIG. 3(*c*)). Curve C denotes a result of XRD pertaining to the mesoporous silica thin film (FIG. 3(*d*)) formed by heating and calcining the thus-dried substrate 1 in an atmosphere at 400° C. for three hours, and by completely thermally decomposing and removing the surfactant serving as a mold. FIG. 10 shows a result of XRD performed during the course of a film growth process in a comparative example where the thin film is not heated overnight in a saturated TEOS atmosphere at a temperature of 135° C. In the drawing, curve "s" denotes a state of the substrate after the substrate has been coated. Curve a2 denotes a result of XRD performed when the silica derivative has been polymerized through hydrolysis polycondensation reaction (i.e., a preliminary crosslinking process (shown in FIG. 3(b))) by holding the coating film for three nights at 90° C. Curve "d" denotes a result of XRD pertaining to the mesoporous silica thin film (FIG. 3(d)) formed by heating and calcining the substrate 1 in an atmosphere at 350° C. for five hours without being dried in the saturated TEOS atmosphere at 135° C., to thereby completely thermally decompose and remove the surfactant serving as a mold.

The vertical axis in the drawing shows the number of reflection counts, scattering counts, diffraction counts per second, and the number of X-ray gratings cps (counts per second) The horizontal axis shows an angle θ of a diffraction peak. Provided that the angle of the diffraction peak is taken as θ, 2d sin θ=λ. From this expression, d=an interval between surfaces of the cyclic structure can be computed. Here, λ denotes the wavelength of an incident X ray.

As shown in FIG. 5, positions of the diffraction peaks of the curves "a," "b," and "c" coincide with each other and maintain a superior crystalline structure. However, when the dielectric film is not subjected to treatment in the TEOS vapor atmosphere, the diffraction peaks deviate from each other, as shown in FIG. 10, and periodic structures are understood to have become collapsed.

From the result, by means of the method of the embodiment, the crosslinking reaction is considered to have proceeded well as a result of the thin film having been subjected to treatment in the TEOS vapor atmosphere, thereby enhancing the strength of the structure and maintaining the porous structure without involvement of collapse even when the substrate is sintered. As a result, the diffraction peaks are considered to have coincided with each other, and calcining of the substrate is considered to have completed well without destruction of the periodic structure.

By means of the configuration, the interlevel dielectric film is formed from a low dielectric thin film made from a mesoporous silica thin film, wherein the silica thin film has superior film strength, a superior characteristic of adhering to the substrate, superior moisture resistance, and an extremely superior orientation characteristic. Therefore, capacitance owing to the interlevel dielectric film can be diminished, whereby FRAM can be fabricated with having a superior switching characteristic as well as a high operation speed.

Further, since the pores are oriented well so as to become parallel with the surface of the substrate, the strength of the substrate is improved, and a low dielectric constant can be formed uniformly in the direction perpendicular to the surface of the substrate. Particularly, thanks to the pores closed structure, no opening section is provided for a lower electrode, wirings of the upper layer and the substrate. Hence, the dielectric film plays the role as an effective low dielectric thin film having superior moisture resistance and enhanced reliability. Accordingly, little leakage current arises, and the interlevel dielectric film becomes longer life.

In the embodiment, the film is exposed to the TEOS vapor atmosphere before being sintered. The silica derivative used as a vapor atmosphere is not limited to TEOS (tetraethoxy silane), and use of a silicon alkoxide material, such as TMOS (tetramethoxy silane), is preferable.

In place of TEOS or TMOS, a silica derivative having the following structural formula expressed by the following formula.

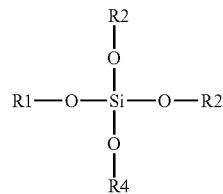

[Chemical Formula 1]

Rn (n=1, 2, 3, 4, ... ) denotes a saturated chain hydrocarbon base such as $CH_3$ or $C_2H_5$; an unsaturated chain hydrocarbon base; an aromatic base such as a benzene ring; or a saturated cyclic hydrocarbon such as cyclohexane, wherein R1, R2, R3, and R4 may be identical with each other or differ from each other. Here, H may also be employed in place of Rn.

R1 may be used in place of R1-O as a silica derivative to be used in the process in connection with the foregoing chemical formula.

More preferably, from among functional groups "R1-O," "R2-O," "R3-O," and "R4-O," first to third atomic groups may be replaced with "R1," "R2," "R3," and "R4." One example is represented by the following formula.

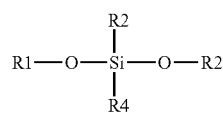

[Chemical Formula 2]

Use of such a sililation agent as a gas enables formation of a mesoporous silica film having extremely superior moisture resistance as well as high strength and high adhesion characteristics. When trimethylchlorosilane is used in lieu of dialkylkoxysilan such as that expressed by Chemical formula 2, the moisture resistance of the film is improved further.

The composition of the precursor solution is not limited to that described in connection with the embodiment. Under the assumption that the solution assumes a value of 150 (100 parts water+50 parts ethanol), the surfactant might be preferably taken a value of 0.1 to 5; the silica derivative might be preferably taken a value of 0.1 to 10 (more preferably 3.0 to 6.0); and the acid catalyst might be preferably taken a value of 0 to 5 (more preferably 0.5 to 2.5). Use of the precursor solution having the composition enables formation of a dielectric film of low dielectric constant having columnar pores.

In the embodiment, cationic cetyltrimethyl ammonium bromide [CTAB: $C_{16}H_{33}N^+(CH_3)_3Br^-$] is used as a surfactant. Naturally to say, the surfactant might not be limited to such an agent, and another surfactant might be alternatively employed.

In case of using alkali ions, such as Na ions, as catalysts, however, it deteriorates a semiconductor material. Therefore, eventually, use of a cationic surfactant with an acid catalyst might be a preferable option. In placed of HCl, an inorganic catalyst, such as nitric acid ($HNO_3$), sulfuric acid ($H_2SO_4$), phosphoric acid ($H_3PO_4$), $H_4SO_4$, or the like may be used as the acid catalyst. Alternatively, an organic acid catalyst, such as carboxylic acid, sulfonic acid, sulfinic acid, or phenol, may be also used.

The silica derivative used as raw material is not limited to TMOS. Silicon alkoxide material, such as tetraethoxy silane (TEOS), is preferably used.

Further, the water $H_2O$/alcohol mixed solvent is used as a solvent. However, it might be the case of only water being used.

Moreover, although the atmosphere is used as a calcining atmosphere, calcining may be performed in an oxygen atmosphere, under reduced pressure, or in a nitrogen atmosphere. Preferably, use of a foaming gas formed from a gas mixture consisting of nitrogen and hydrogen enhances moisture resistance, thereby enabling an attempt to reduce a leakage current.

A mixing ratio of the surfactant, the silica derivative, the acid catalyst, and the solvent can be changed as required.

The preliminary crosslinking process is described as being performed at 90° C. overnight. Any temperature and any period of time can be selected from the temperature range of 30° C. to 150° C. and the time range of one to 120 hours, as required. A preferable temperature ranges from 60° C. to 120° C., and a more preferable temperature is 90° C.

As shown in FIG. 13, a contraction rate of the film is measured before and after calcining while the processing time is changed in the process for exposing the film to saturation vapor pressure of TEOS at 135° C. FIG. 14 shows measurement results. The vertical axis shows a contraction rate, and the horizontal axis shows a treatment time.

As is apparent from FIG. 14, performing the process for exposing the film to the saturation vapor pressure of TEOS for three hours to three nights or thereabouts is sufficient. A preferable temperature of the TEOS vapor is 135° C. or thereabouts, and 120° C. to 180° C. or thereabouts may also be preferable. As the temperature of the TEOS vapor increases, the expected time required for attaining an equivalent contraction inhibition effect becomes shorter. A desirable time during which TEOS is treated in vapor is six hours or more, more preferably 12 hours or more. Moreover, an attempt to shorten a process time can be realized by supplying the TEOS vapor to the container from the outside, increasing the TEOS partial pressure, and increasing the process temperature. The only requirement is to expose the film to the vapor of silica derivative. Hence, the temperature is not limited to 135° C. A temperature of 90° C. or less may also be employed. The upper limit temperature may be a temperature at which thermal decomposition of a surfactant starts (e.g., 200° C. to 250° C.) or less.

The calcining process is set to be performed for three hours at 400° C. However, the calcining process may be performed at 300° C. to 500° C. for one to five hours; preferably 350° C. to 450° C.

In addition, in the embodiment, the film is exposed to the saturation vapor pressure of TEOS or less before being subjected to calcining. However, the substrate may be sintered in a vapor atmosphere of silica derivative such as TEOS. In this case, sediments, such as oxides, may be deposited on the surface of the substrate. In this case, the sediments should be removed by subjecting the substrate to surface treatment after the substrate has been sintered.

Second Embodiment

Figure 6:
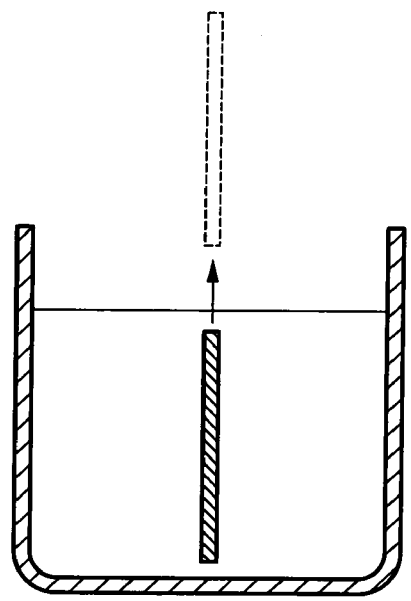
FIG. 6 is a descriptive view showing a process for forming a dielectric film according to a second embodiment of the invention.

In the first embodiment, the mesoporous silica thin film is formed by means of the spin coating method. Formation of the mesoporous silica thin film is not limited to the spin coating method. As shown in FIG. 6, a dip coating method may also be employed.

Specifically, the substrate is lowered in a direction perpendicular to a liquid surface of the prepared precursor solution at a speed of 1 mm/s through 10 m/s until it sinks in the solution to be left stationary in the solution for one second to one hour.

After lapse of a desired period of time, the substrate is pulled up in said perpendicular direction at a rate of 1 mm/s through 10 m/s until being taken out of the solution.

As in the case of the first embodiment, the substrate is held overnight at 90° C., whereby the silica derivative is polymerized through a hydrolysis and polycondensation reaction. Subsequently, the substrate is heated for three to 12 hours in a saturated TEOS atmosphere at 135° C. Finally, the substrate 1 is heated and sintered for three hours in an oxygen atmosphere at 400° C., to thereby completely thermally decompose and remove the surfactant serving as a mold. Thus, a pure mesoporous silica thin film is formed.

In addition to the foregoing method, a method for dropping the precursor solution on the substrate is also effective as the dip coating method.

Third Embodiment

Figure 7:
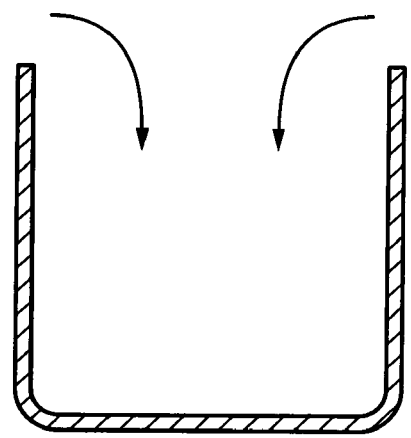
FIGS. 7(a) and 7(b) are the descriptive views showing a process for forming a dielectric film according to a third embodiment of the invention.
Figure 7:
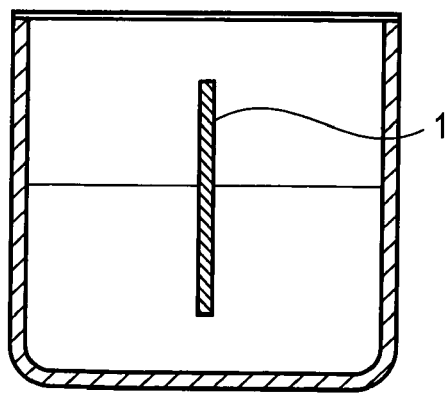

In the first embodiment, the mesoporous silica thin film is formed by means of applying the precursor solution through the spin coating method. Formation of the mesoporous silica thin film is not limited to the spin coating method. As shown in FIGS. 7A and 7B, an immersion method may also be employed.

As shown in FIG. 7(a), as in the case of the previous embodiments, the mixed precursor solution is prepared, and the substrate 1 having the MOSFET fabricated therein is immersed in the solution in the manner as shown in FIG. 7(b). This coated substrate 1 is held for one night at 90° C., whereby the silica derivative is subjected to polymerization through hydrolysis (polycondensation reaction) (i.e., a preliminary crosslinking process), thereby forming a mesoporous silica thin film having cavities, the cavities being formed by taking a cyclic self-assembly of the surfactant as a mold.

Finally, as in the case of the first embodiment, the substrate is held for two nights at 90° C., whereby the silica derivative is polymerized through a hydrolysis decomposition polycondensation reaction. Subsequently, the substrate is dried for one night in a saturated TMOS atmosphere at 135° C. Finally, the substrate 1 is heated and sintered for three hours in an oxygen atmosphere at 400° C., to thereby completely thermally decompose and remove the surfactant serving as a mold. Thus, a pure mesoporous silica thin film can be formed.

According to such a configuration, the film has a cyclic porous structure, and hence the mechanical strength of the film can be improved so that a highly reliable dielectric film can be obtained. Further, the pores are oriented in parallel with the surface of the substrate. Hence, a low dielectric constant can be formed uniformly in the direction perpendicular to the surface of the substrate. When the dielectric film is used as an interlevel dielectric film, the pores have a closed structure where no opening sections is provided either to the upper layer's wirings or lower layer's wirings. Hence, the dielectric film plays the role of an effective low dielectric thin film having superior moisture resistance and enhanced reliability.

Fourth Embodiment

Figure 8:
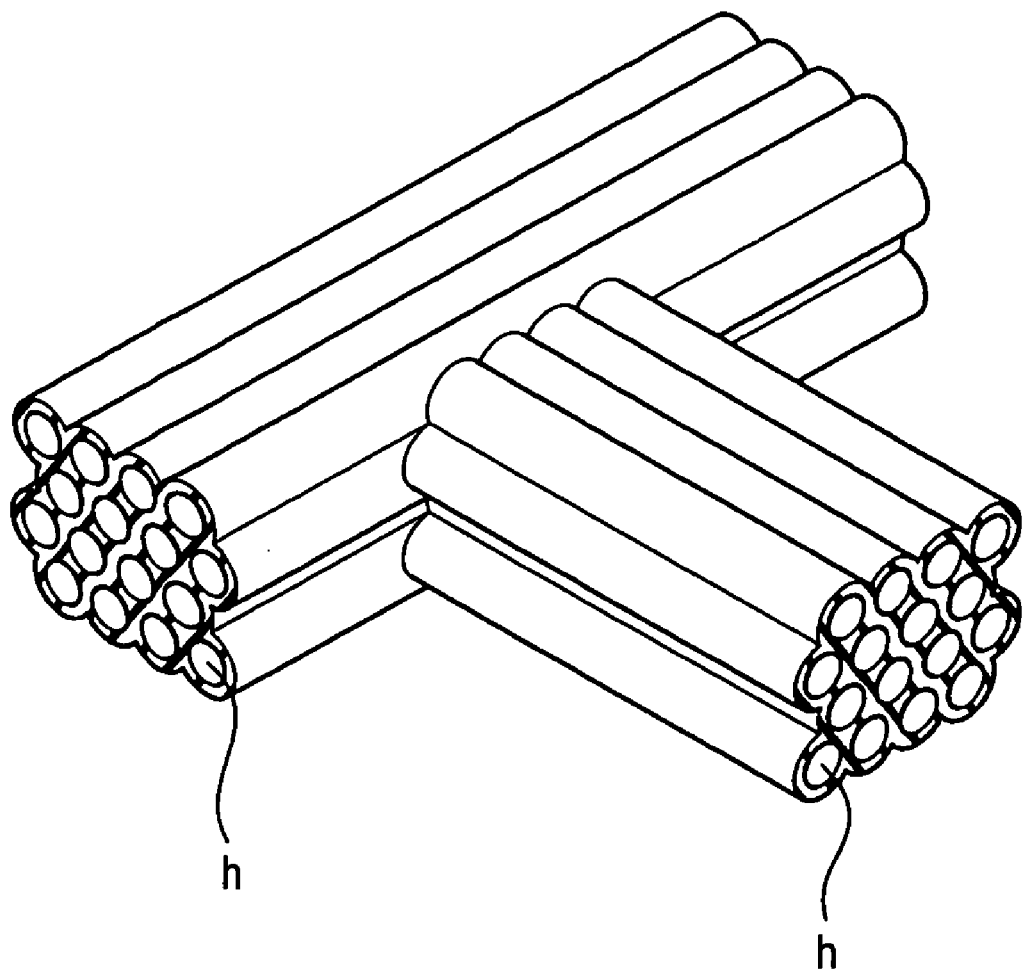
FIG. 8 is a descriptive view showing a dielectric film according to a fourth embodiment of the invention.

Although the embodiments have described the dielectric film which includes a plurality of cyclic porous structure domains including columnar pores oriented in one direction and in which adjacent porous structure domains are oriented in different directions, the dielectric film may be formed such that the pores "h" are oriented in one direction over the entire surface of the substrate, as shown in FIG. 8.

Fifth Embodiment

Figure 9:
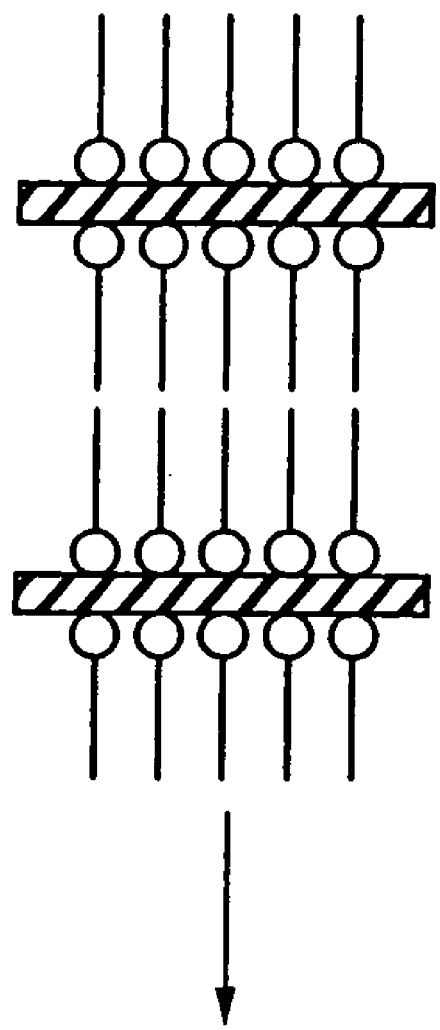
FIGS. 9(a) and 9(b) are the descriptive views showing a dielectric film according to a fifth embodiment of the invention.
Figure 9:
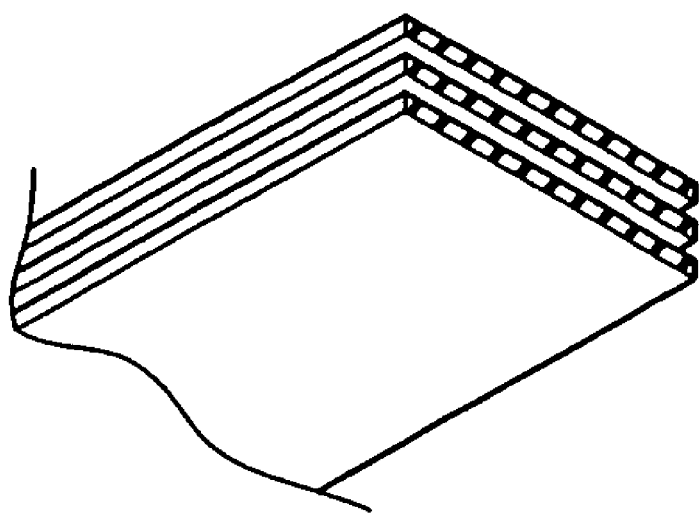

Further, as shown in FIG. 9(b), a structure in which the pores "h" are oriented in a layered form is also effective. The dielectric film is formed by increasing the concentration of the surfactant in the precursor solution. The other processes are the same as those described in connection with the first through fourth embodiments.

When the concentration of the surfactant in the structure shown in FIG. 4(c) is further increased, molecules are oriented in a layered pattern, as shown in FIG. 9(a). There is formed a dielectric film of low dielectric constant in which the pores "h" such as those shown in FIG. 9(b) are oriented in a layered form. Such a configuration realizes an attempt to increase the porosity further and reduce the dielectric constant as compared with the case of the structure having the cylindrical pores.

At the time of formation of the precursor solution, the structure of the resultant structural body is known to change according to a proportion of the surfactant to the silica derivative.

For instance, when a molecular ratio of the surfactant to the silica derivative, such as CATB/TEOS, assumes a value of 0.3 to 0.8, a three-dimensional network structure (cubic structure) is known to be obtained. If the molecular ratio is lower than this molecular ratio and assumes a value of 0.1 to 0.5, there is obtained a dielectric film of low dielectric constant in which columnar pores are oriented. In contrast, when the molecular ratio is greater than that molecular ratio and assumes a value of 0.5 to 2, there is obtained a dielectric film of low dielectric constant in which layered pores are oriented.

The embodiment has described the coating method using the spinner. However, a so-called brush painting method for applying a solution with a brush is also applicable.

The preliminary crosslinking process is performed before the contact process for coating or immersing the substrate, whereby the precursor solution that has initiated the preliminary crosslinking reaction can be brought into contact with the substrate. Further, after the precursor solution has been brought into contact with the substrate, the preliminary crosslinking may be performed.

In addition, the embodiment has described the interlevel dielectric film of FRAM. However, the invention can also be applied to various semiconductor devices using silicon; a high-speed device including a device, such as HEMT, which uses a compound semiconductor; a high-frequency device such as a microwave IC; highly-integrated ferroelectric memory of MFMIS type; and a microwave transmission line or multilayer wiring board using a film carrier or the like.

INDUSTRIAL APPLICABILITY

As has been described above, according to the invention, the surfactant and the silica derivative are dissolved into a solvent at a desired mole ratio, to thereby prepare a precursor solution. The solution is applied over the substrate. The silica derivative is subjected to polymerization through hydrolysis decomposition (a polycondensation reaction) (i.e., a preliminary crosslinking process), thereby forming a mesoporous silica thin film having cavities, the cavities being formed by taking a cyclic self-assembly of the surfactant as a mold. The substrate is exposed to a silica derivative atmosphere before being subjected to calcining, and a silica derivative is supplied. As a result, contraction of the film is inhibited. There can be formed a sturdy mesoporous silica thin film which takes the self-assembly of the surfactant as a mold while the cavities are maintained intact without being fractured.

Accordingly, there can be readily obtained, with superior controllability, a dielectric film which has extremely high mechanical strength, an extremely high adhesion property, and a low dielectric constant.

The invention claimed is:

1. A method for manufacturing a semiconductor device, comprising:
    a process of producing a precursor solution containing a silica derivative and a surface active agent;
    a contact process for bringing the precursor solution into contact with the surface of a substrate;
    a treatment process for exposing to a silica derivative atmosphere the substrate with which the precursor solution has been brought into contact; and
    a process for sintering the substrate to decompose and remove the surface active agent, whereby a dielectric film is formed,
    wherein the treatment process includes a process for bringing the substrate into contact with silica derivative vapor at a temperature at which the surface active agent is not thermally decomposed.

2. The method for manufacturing a semiconductor device according to claim 1, wherein the treatment process is performed at a saturation vapor pressure of silica derivative vapor.

3. The method for manufacturing a semiconductor device according to claim 1, wherein the treatment process is performed at a temperature of 90° C. to 200° C.

4. The method for manufacturing a semiconductor device according to claim 1, wherein the contact process is a process for coating the substrate with the precursor solution.

5. The method for manufacturing a semiconductor device according to claim 4, wherein the contact process is a spin coating process for dropping the precursor solution on the substrate and spinning the substrate.

6. The method for manufacturing a semiconductor device according to claim 1, further comprising a preliminary crosslinking process for raising the temperature of the precursor solution to initiate a crosslinking reaction.

7. The method for manufacturing a semiconductor device according to claim 1, wherein the decomposition removal process is performed in the same process as that of the treatment process, and the substrate is sintered in a silica derivative atmosphere, to thereby decompose and remove the surface active agent and form a dielectric film.

8. The method for manufacturing a semiconductor device according to claim 1, wherein the silica derivative of the silica derivative atmosphere is alkylsilane halide.

9. The method for manufacturing a semiconductor device according to claim 1, wherein the silica derivative of the silica derivative atmosphere is alkoxysilane halide.

10. The method for manufacturing a semiconductor device according to claim 1, wherein the silica derivative of the silica derivative atmosphere is alkylalkoxysilane halide.

11. The method for manufacturing a semiconductor device according to claim 1, wherein the silica derivative of the silica derivative atmosphere is alkoxysilane.

12. The method for manufacturing a semiconductor device according to claim 1, wherein the silica derivative of the silica derivative atmosphere is alkylalkoxysilane.

* * * * *